United States Patent [19]

Anthony et al.

[11] 3,988,768

[45] Oct. 26, 1976

[54] DEEP DIODE SILICON CONTROLLED RECTIFIER

[75] Inventors: Thomas R. Anthony; Harvey E. Cline, both of Schenectady, N.Y.

[73] Assignee: General Electric Company, Schenectady, N.Y.

[22] Filed: Feb. 28, 1975

[21] Appl. No.: 554,172

Related U.S. Application Data

[63] Continuation of Ser. No. 411,004, Oct. 30, 1973, abandoned.

[52] U.S. Cl. .................................. 357/60; 357/38; 148/1.5; 357/89; 357/90
[51] Int. Cl.² ................. H01L 29/74; H01L 29/04; H01L 7/00
[58] Field of Search ................. 357/38, 60, 89, 90; 148/1.5

[56] References Cited
UNITED STATES PATENTS

| | | | |
|---|---|---|---|
| 2,813,048 | 11/1957 | Pfann | 357/60 |
| 3,727,116 | 4/1973 | Thomas et al. | 357/38 |
| 3,737,741 | 6/1973 | Bartelink et al. | 357/38 |

Primary Examiner—Edward J. Wojciechowicz
Attorney, Agent, or Firm—Donald M. Winegar; Joseph T. Cohen; Jerome C. Squillaro

[57] ABSTRACT

A semiconductor controlled rectifier has a lamellar body of semiconductor material of at least one group of four alternate first and second regions of opposite type conductivity. The second regions are made from recrystallized semiconductor material of the first regions and contain a sufficient level of concentration of a dopant impurity to impart thereto the opposite type conductivity. It is recrystallized material with solid solubility of the impurity. The controlled rectifier is turned on and off by either a control electrode or a source of illumination.

26 Claims, 13 Drawing Figures

DEEP DIODE SILICON CONTROLLED RECTIFIER

This is a continuation, of application Ser. No. 411,004, filed 10/30/73, now abandoned.

BACKGROUND OF THE INVENTION

1. Field of the Invention

This invention relates to semiconductor controlled rectifiers and a method of making the same.

2. Description of the Prior Art

A semiconductor controlled rectifier (SCR) may be produced by several different P-N junction-forming techniques. Suitable techniques include alloying, diffusion and epitaxial growth. Diffusion and alloying have proved to be the most popular techniques because they lend themselves to the economical mass production of SCRs. However, both techniques result in P-N junctions which are not very sharply defined although they may meet the requirement of a "step" P-N junction. Also, the width of the P-N junction varies with the process temperature employed. In addition, the diffusion process results in a region having non-uniform impurity concentration throughout the region.

The material of regions formed by alloying techniques is recrystallized material. These regions are limited in depth and area covered because the alloying process requires the formation of a molten mixture of the semiconductor material and either a donor or an acceptor material as the impurity material and subsequent solidification of the same to form the desired region. Moreover, it is very difficult to control the exact depth of an alloyed junction because the amount of molten mixture that is formed on alloying is a function of both the absolute temperature and the amount of metal-rich component placed on the semiconductor to form the alloy. In addition, the molten material must be prevented from flowing outside of a confined area otherwise the device may be inoperable. Usually, the process is limited to that portion of the device immediately adjacent to an electrical contact. Thus, most often, the alloying process is practiced when an electrical contact is affixed to the device.

In either case, the diffusion and alloying techniques are practiced only through a surface area and form regions therein which are only adjacent to the major surfaces involved. Because of the elapsed time and high temperature required for the diffusion process, the regions produced are limited in size. Any additional high temperature processing of the processed body readily affects the P-N junctions which have been previously formed and tends to enlarge the different regions and alter the configuration of the P-N junction.

Epitaxial growth techniques overcome some of the difficulties encountered by the diffusion and alloying techniques. Regions of fairly uniform resistivity are easily grown. However, the temperatures and the rate of growth of material are factors which limit the thickness of a region that can be grown economically. The P-N junction which results from epitaxial growth techniques is more sharply defined than the junctions made by alloying and diffusion.

In all instances, however, theoretical breakdown voltages and operating characteristics are not achieved. High temperatures for extended periods of time adversely affect the crystalline perfection of the substrate material. It also causes the P-N junction already present in the processed material to move and may also result in the out diffusion of dopant impurities thereby changing the resistivity of the region or regions of semiconductor material involved. Additionally, the processes deposit impurities within or on surfaces of the regions and at P-N junctions formed by the epitaxial process thereby detrimentally affecting the operating characteristics of the devices.

None of the semiconductor controlled rectifiers manufactured to date have several regions made from recrystallized substrate material. In addition, the semiconductor controlled rectifiers have usually been limited to four regions for controlled rectifier applications and to five regions for bidirectional switching applications. Such structural limitations have resulted from extensive process time and high process temperatures encountered in making the devices.

An object of this invention is to provide a new and improved semiconductor controlled rectifier.

Another object of this invention is to provide a new and improved semiconductor controlled rectifier wherein selected alternate regions of opposite type conductivity having a constant uniform dopant impurity concentration throughout the selected regions are formed from recrystallized regions of the substrate.

Another object of this invention is to provide a new and improved semiconductor controlled rectifier wherein the P-N junctions formed therein are well defined and have a minimum width to provide a step P-N junction.

Other objects of this invention will, in part, be obvious and will, in part, appear hereinafter.

BRIEF DESCRIPTION OF THE INVENTION

In accordance with the teachings of this invention, there is provided a semiconductor device comprising a lamellar body of semiconductor material of at least one group of four alternate first and second regions of opposite type conductivity and having two major opposed surfaces. The first regions are of a first type conductivity and a selected resistivity. One of the first regions has a surface area which is one of the major surfaces of the device. The material of the second regions is recrystallized semiconductor material comprising the first regions and containing a dopant impurity concentration sufficient for the second regions to be of the second and opposite type conductivity. One of the second regions has a surface area which is the other of the two major opposed surfaces of the body. A P-N junction is formed by the contiguous surface of regions of opposite type conductivity. Electrical contacts are affixed to each one of the two major opposed surfaces. A control electrode affixed to any of the remaining first and second regions turns the device on and off. The device may also be turned on and off by use of a light source such, for example, as a laser beam or light emitting diode being directed to illuminate one of the plurality of P-N junctions. An alternate embodiment of this semiconductor controlled rectifier comprises two or more integral groups of four alternate first and second regions. A P-N junction is formed by the contiguous surfaces of regions of opposite type conductivity of mutually adjacent groups.

DESCRIPTION OF THE INVENTION

Figure 1:
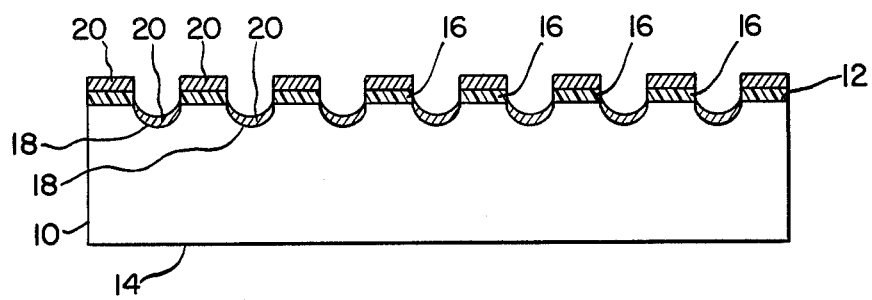
FIGS. 1, 2 and 3 are elevation views, in cross-section, of a body of semiconductor material processed in accordance with the teachings of this invention.

With reference to FIG. 1, there is shown a body 10 of semiconductor material having a selected resistivity and a first type conductivity. The body 10 has opposed major surfaces 12 and 14 which are the top and bottom surfaces respectively thereof. The semiconductor material comprising the body 10 may be silicon, germanium, silicon carbide, gallium arsenide, a compound of a Group II element and a Group VI element and a compound of a Group III and a Group V element.

The body 10 is mechanically polished, chemically etched to remove any damaged surfaces, rinsed in deionized water and dried in air. An acid resistant mask 16 is disposed on the surface 12 of the body 10. Preferably, the mask is of silicon oxide which is either thermally grown or vapor deposited on the surface 12 by any of the methods well known to those skilled in the art. Employing well known photolithographical techniques, a photoresist, such, for example, as Kodak Metal Etch Resist, is disposed on the surface of the silicon oxide layer 16. The resist is dried by baking at a temperature of about 80° C. A suitable mask of an array of spaced lines of a predetermined width and spaced a predetermined distance apart is disposed on the layer of photoresist and exposed to ultraviolet light. After exposure, the layer of photoresist is washed in Xylene to open windows in the mask where the lines are desired so as to be able to selectively etch the silicon oxide layer 16 exposed in the windows.

The lines in the mask may each be of the same width or of a different width depending upon the design of the switching device to be made. Additionally, the operating characteristics of the switching device determines the distance between the center lines of the adjacent lines in the mask.

Selective etching of the layer 16 of silicon oxide is accomplished with a buffered hydrofluoric acid solution ($NH_4F$-HF). The etching is continued until a second set of windows corresponding to the windows of the photoresist mask are opened in the layer 16 of silicon oxide to expose selective portions of the surface 12 of the body 10 of silicon. The processed body 10 is rinsed in deionized water and dried. The remainder of the photoresist mask is removed by immersion in concentrated sulphuric acid at 180° C or immersion in a mixture of 1 part by volume hydrogen peroxide and 1 part by volume concentrated sulphuric acid.

Selective etching of the exposed surface area of the body 10 is accomplished with a mixed acid solution. The mixed acid solution is 10 parts by volume nitric acid, 70 percent, 4 parts by volume acetic acid, 100 percent, and 1 part by volume hydrofluoric acid, 48 percent. At a temperature of from 20° C to 30° C, the mixed solution selectively etches the silicon of the body 10 at a rate of approximately 5 microns per minute. A trough 18 is etched in the surface 12 of the body 10 beneath each window of the oxide layer 16. The selective etching is continued until the depth of the trough 18 is approximately equal to the width of the window in the silicon oxide layer 16. However, it has been discovered, that the trough 18 should not be greater than approximately 100 microns in depth because undercutting of the silicon oxide layer 16 will occur. Undercutting of the layer 16 of silicon oxide has a detrimental effect on the width of the device to be migrated through the body 10. Etching for approximately 5 minutes at a temperature of 25° C will result in a trough 18 of from 25 to 30 microns in depth for a window width of from 10 to 500 microns. The etched body 10 is rinsed in distilled water and blown dry. Preferably, a gas such, for example as, freon, argon and the like, is suitable for drying the processed body 10.

The processed body 10 is disposed in a metal evaporation chamber. A metal layer 20 is deposited on the remaining portions of the layer 16 of silicon oxide and on the exposed silicon in the troughs 18. The metal in the troughs 18 are the metal "wires" to be migrated through the body 10. The metal of the layer 20 comprises a material, either substantially pure in itself or suitably doped by one or more materials to impact a second and opposite type conductivity to the material of the body 10 through which it migrates. The thickness of the layer 20 is approximately equal to the depth of the trough 18. Therefore, if the trough 18 is 20 microns deep, the layer 20 is approximately 20 microns in thickness. A suitable material for the metal layer 20 is aluminum to obtain P-type regions in N-type silicon semiconductor material. Prior to migrating the metal wires in the troughs 18 through the body of silicon 10, the excess metal of the layer 20 is removed from the silicon oxide layer 16 by such suitable means as grinding the excess metal with a 600 grit carbide paper.

It has been discovered that the vapor deposition of the layer 20 of aluminum metal should be performed at a pressure of approximately $1 \times 10^{-5}$ torr but not greater than $5 \times 10^{-5}$. When the pressure is greater than $5 \times 10^{-5}$ torr, we have found that in the case of aluminum metal vapor deposited in the troughs 18, the aluminum does not penetrate into the silicon and migrate through the body 10. It is believed that the layer of aluminum is saturated with oxygen and prevents reduction by the aluminum metal of the very thin silicon oxide layer between the deposited aluminum and the silicon that was formed in the air shortly after etching the troughs 18. Thus, the initial melt of aluminum and silicon required for migration is not obtained because of the inability of aluminum to wet the silicon interface. In a like manner, aluminum deposited by sputtering is not desirable as the aluminum appears to be saturated with oxygen from the process, thereby preventing the reduction of any intervening silicon oxide. The preferred methods of depositing aluminum on the silicon body 10 are by the electron beam method and the like wherein little if any oxygen can be trapped in the aluminum.

The processed body 10 is placed in a thermomigration apparatus, not shown, and the metal "wires" in the troughs 18 are migrated through the body 10 by a thermal gradient zone melting process. A thermal gradient of approximately 50° C per centimeter between the bottom surface 14, which is the hot face and the surface 12, which is the cold face, has been discovered to be appropriate at an apparatus operating temperature of from 800° C to 1400° C. The process is practiced for a sufficient length of time to migrate all the metal "wires" through the body 10. For example, for aluminum "wires" of 20 microns thickness, a thermal gradient of 50° C/cm, a 1200° C mean temperature of body 10, a pressure of $1 \times 10^{-5}$ torr, and a furnace time of less than 12 hours is required to migrate the wires through a silicon body 10 of one centimeter thickness.

The temperature gradient zone melting process and apparatus therefore is not part of this invention. For a more thorough understanding of the temperature gradient zone melting process employed in this invention and for a more thorough description of the apparatus employed for the process, one is directed to our copending applications entitled Method of Making Deep Diode Devices, Ser. No. 411,150; Deep Diode Device Production and Method, Ser. No. 411,021; Deep Diode Devices and Method and Apparatus, Ser. No. 411,001; High Velocity Thermomigration Method of Making Deep Diodes, Ser. No. 411,015; Deep Diode Device Having Dislocation-Free P-N Junctions and Method, Ser. No. 411,009; and The Stabilized Droplet Method of Making Deep Diodes Having Uniform Electrical Properties, Ser. No. 411,008. A more thorough discussion of which crystallographic planes are preferred for disposing the metal wires thereupon and the preferred crystal axis for migration shall be found in our copending application entitled Deep Diode Line Migration, Ser. No. 411,018, being filed concurrently with this patent application and assigned to the same assignee of this invention.

Figure 2:
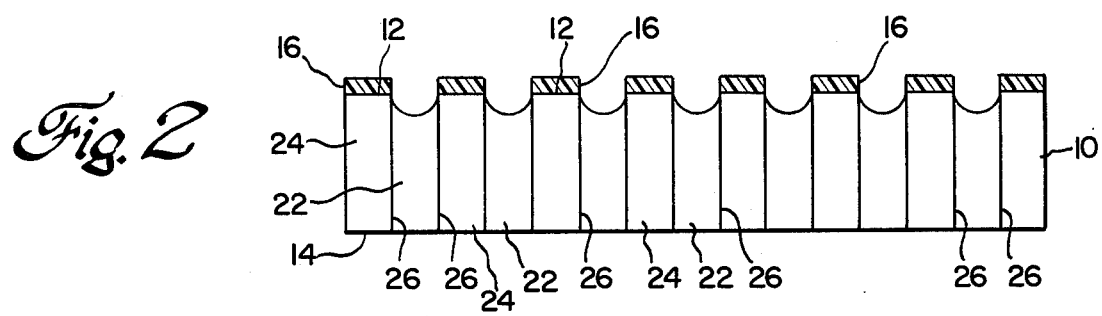

Upon completion of the temperature gradient zone melting process, the resulting processed body 10 is as shown in FIG. 2. The thermal migration of the metal "wires" in the troughs 18 through the body 10 produces a body 10 having a plurality of first spaced regions 22 of a second and opposite type conductivity than the body 10. Each region is recrystallized material of the body 10 suitably doped with a material comprising the metal wire and having an impurity concentration sufficient to obtain the desired conductivity. The metal retained in the recrystallized region is substantially the maximum allowed by the solid solubility of the metal in the semiconductor material through which it has been thermomigrated. It is recrystallized material of the body 10 having solid solubility of the metal therein. The region 22 has a constant uniform level of impurity concentration throughout the entire planar region. The thickness of the region 22 is substantially constant for the entire region. The peripheral surface of each planar region 22 comprises in part the top surface 12, the bottom surface 14, and the peripheral side surface of the body 10.

Additionally, the body 10 is divided into a plurality of spaced regions 24 having the same, or first, type conductivity as the body 10. A P-N junction 26 is formed by the contiguous surfaces of each pair of mutually adjacent regions 22 and 24 of opposite type conductivity. The P-N junction 26, as formed, is very abrupt and distinct resulting in a step junction. Each P-N junction is approximately 18 microns in thickness.

Figure 3:
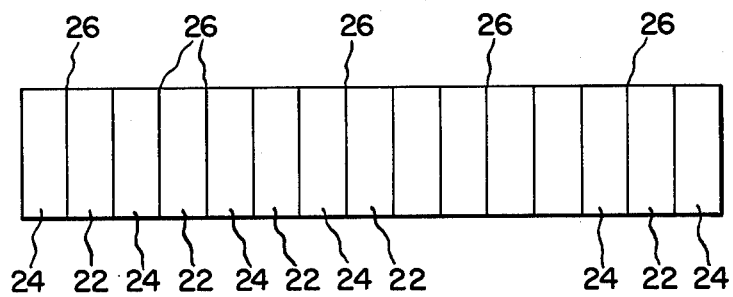

The resulting structure is a lamellar body of at least one group of four alternate regions, 24 and 22 respectively, of opposite type conductivity as shown in FIG. 3. Each region 22 and 24 is substantially a planar region. The structure may also be divided into a plurality of chips having a similar configuration.

Figure 4:
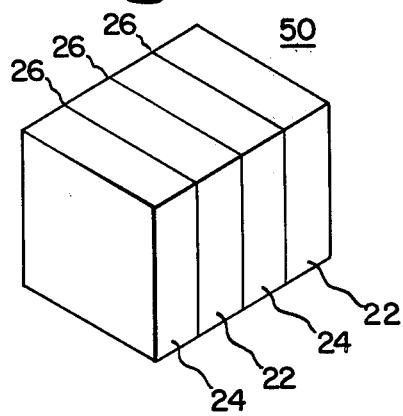
FIG. 4 is an isometric view of a semiconductor device made in accordance with the teachings of this invention.
Figure 5:
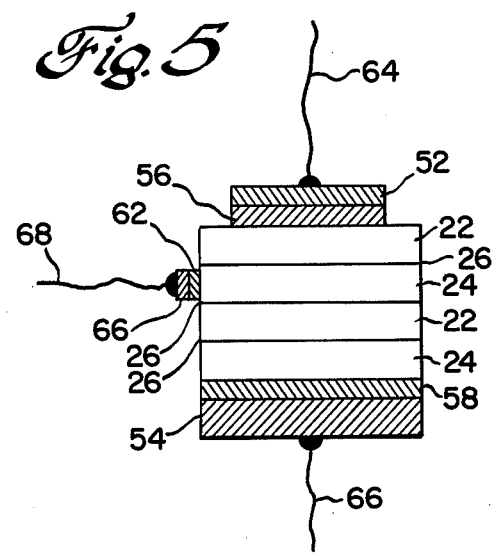
FIG. 5 is an elevation view, partly in cross-section, of a semiconductor controlled rectifier made in accordance with the teachings of this invention.

Referring now to FIG. 4, there is shown a semiconductor controlled rectifier (SCR) 50 embodying the basic structure of the processed body 10 as a 4-region switching device. The SCR 50 has four alternate regions of opposite type conductivity. A P-N junction 26 is formed by the contiguous surfaces of the substantially planar regions 22 and 24. The complete SCR 50 is as shown in FIG. 5 wherein electrical contacts 52 and 54 are affixed by ohmic solder layers 56 and 58 respectively to the respective one of the regions 22 and 24. Control electrode 60 is affixed to the other of the regions 24 by an ohmic solder layer 62. An electrical lead 64 is affixed to contact 52, and an electrical lead 66 is affixed to contact 54 and an electrical lead 68 is affixed to the contact 60. One or more of the leads 64, 66 and 68 may be affixed by either permanent joining means or by compression bonding encapsulation techniques incorporated in packaging of the device 50.

A high voltage semiconductor controlled rectifier consisting of two or more integral groups of four alternate regions 22 and 24 is also made from the processed body 10 of FIG. 3. The number of integral groups of regions 24 and the number of regions 22 which are necessary for the desired operating voltage of the device are determined and the desired configuration is either cut from the body 10 or the body 10 is processed accordingly. For example, with reference to FIG. 6, a semiconductor controlled rectifier SCR 110 comprises a plurality of groups of four planar regions 24 and 22 of alternate type conductivity functioning as a plurality of series connected thyristors. A P-N junction 26 is formed by the contiguous surfaces of regions 24 and 22.

Each region 24 has N-type conductivity semiconductor material having a carrier concentration of $5 \times 10^{14}$ atoms per cubic centimeter and a resistivity of 10 ohm-centimeter. Each region 22 has P-type conductivity semiconductor material having a carrier concentration of $2 \times 10^{19}$ atoms per cubic centimeter and a resistivity of $8 \times 10^{-3}$ ohm-centimeter.

Each of the regions 22 and 24 is 5 mils, or 125 microns in thickness. A twenty P-N junction semiconductor controlled rectifier device of these aforesaid dimensions and having the physical dimensions of a length of 1 centimeter, a width of 0.2 centimeter and an overall thickness of 0.6 centimeter was prepared from the processed body 10 and tested electrically. The turn on current was $10^{-6}$ amperes, the breakdown voltage was 4.5 kilovolts and the breakover current was $10^{-9}$ amperes.

The results achieved for the device 110 having the dimensions and characteristics described were unexpected. The excellent values obtained indicate that little contamination of the body 10 occurs during this novel temperature gradient zone melting process. Examination of the P-N junctions revealed them to be well defined and about 0.3 microns in width thereby producing a step junction.

Figure 7:
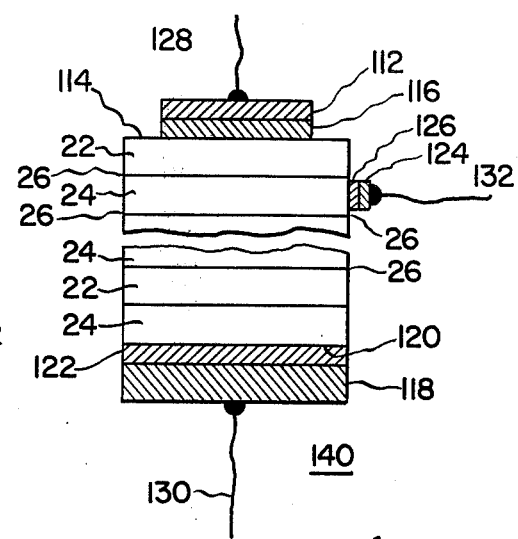
FIGS. 7 and 8 are elevation views, partly in cross-section, of semiconductor controlled rectifiers made in accordance with the teachings of this invention.

Referring now to FIG. 7, a semiconductor controlled rectifier 140 embodying the device 110 is completed by affixing a first electrical contact 112 to the top surface 114 of the device by means of an ohmic solder layer 116. A second electrical contact 118 is affixed by a layer 118 of ohmic solder material to the bottom surface 120 of the device 110 by a layer 122 of ohmic solder material. A third electrical contact 124, a control electrode, is affixed to any of the remaining regions 22 and 24. Electrical leads 128, 130 and 132 are affixed to the respective contacts 112, 118 and 124. When a potential difference is maintained between the contacts, an electrical pulse of the proper polarity applied via the contact 124 switches, or turns the completed device on and off.

Figure 6:
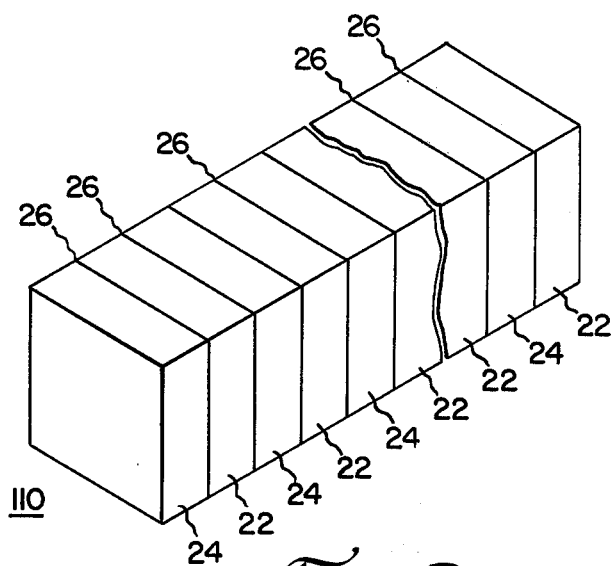
FIG. 6 is an isometric view of a semiconductor device made in accordance with the teachings of this invention.
Figure 8:
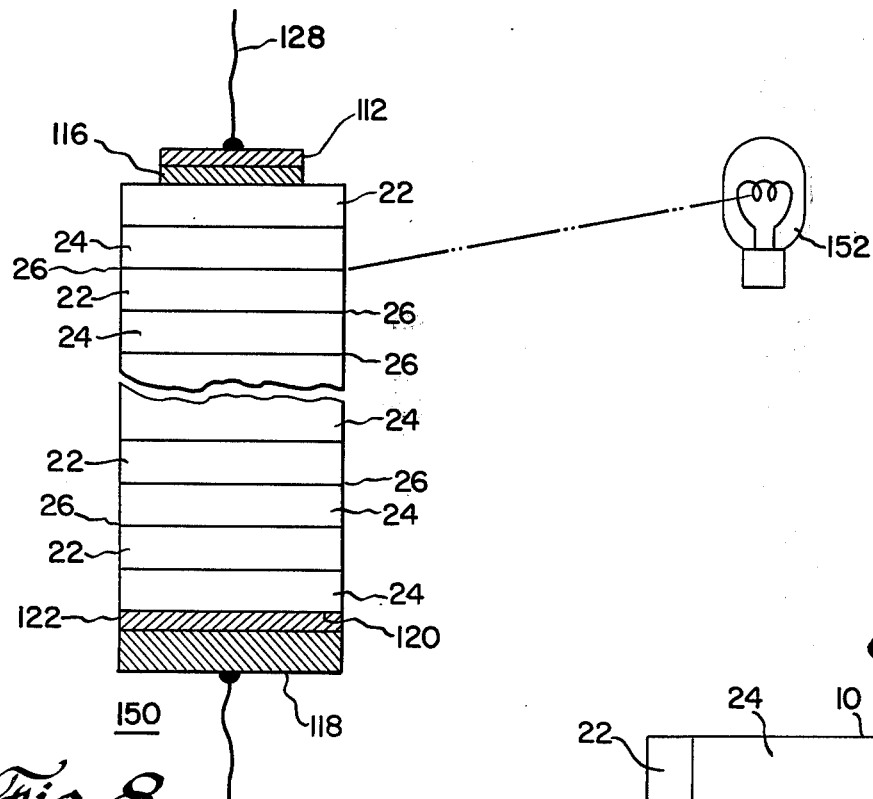

With reference to FIG. 8, there is shown another semiconductor switching device 150 embodying the device 110 of FIG. 6, and which is an alternate embodiment of the device 140. Everything is exactly the same in both devices 140 and 150 except that the device does not have a control electrode 124. A source 152 of illumination such, for example, as a laser beam or a light emitting diode of less than 1 micron wavelength is directed by suitable means, not shown, on any of the P-N junctions 26 to turn on the device 15. Removal of the source 152 of illumination turns off the device 150.

To obtain the most desirable electrical characteristics for a semiconductor controlled rectifier it is necessary that each of the regions 22 and 24 have specific widths and resistances.

Figure 9:
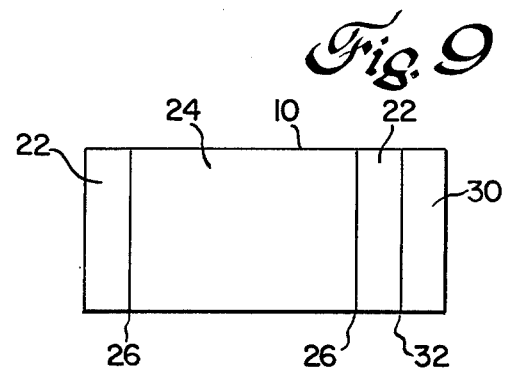
FIG. 9 is an elevation view, in cross-section of a body of semiconductor material processed in accordance with an alternate embodiment of the process of this invention.

With respect to FIG. 9, there is shown an alternate method of processing the body 10 of FIGS. 1 through 3. As described heretofore, aluminum "wire" is migrated by the temperature gradient zone melting (TGZM) process to form the regions 22 of P-type conductivity in the body 10 of N-type conductivity silicon. The regions 22 are each approximately 1 mil in thickness and each has a doping level of $2 \times 10^{19}$ atoms of aluminum per cubic centimeter. The region 24 is approximately 5 mils in thickness, has 10 ohm centimeter resistivity and a doping level of $1 \times 10^{14}$ atoms of antimony per cubic centimeter. A second TGZM process is practiced thereafter and a tinantimony or gold-antimony alloy is migrated through the body 10 to form an $N^+$ region 30. The doping level of the $N^+$ region 30 is approximately $1 \times 10^{19}$ atoms of antimony per cubic centimeter. A P-N junction 32 is formed by contiguous surfaces of regions 30 and 22. The width of the region is approximately 1 mil. Care is exersized to assure one that the region 30 is properly formed by having the gold-antimony alloy "wire" migrate through a selected portion of the region 22 immediately adjacent and in abutting relationship with the new region 30 to be formed. This overlapping migration of metal wires prevents having a situation arise wherein an undesirable region of N-type conductivity having a carrier concentration of only $1 \times 10^{14}$ atoms of dopant material per cubic centimeter separating the regions 30 from the region 22 and detrimentally affecting the electrical characteristics of the controlled rectifier embodying this configuration of the body 10. The body 10 in essence would have a $P^+$-$N$-$P^+$-$N$-$N^+$ configuration instead of the desired $P^+$-$N$-$P^+$-$N^+$ configuration.

Figure 10:
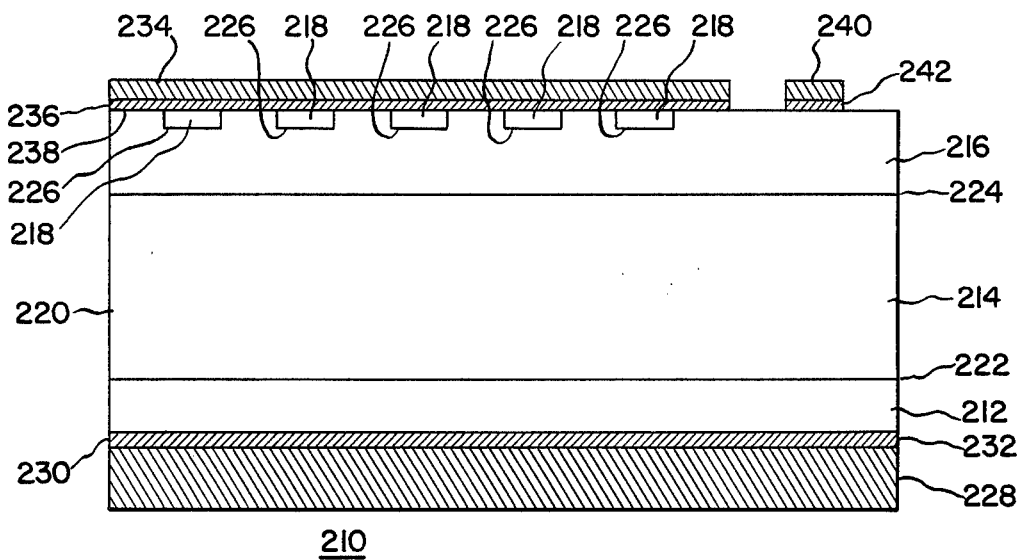
FIGS. 10 and 11 are elevation views, in cross-section, of semiconductor controlled rectifiers made in accordance with the teachings of this invention.

The regions 22 and 30 function as the anode and cathode layers respectively of controlled rectifier embodying the processed body 10 of FIG. 10. These regions 22 and 30 also function as emitters of their respective PNP (22, 24, 22) and NPN (24, 22, 30) transistors and are highly doped relative to the central layers to insure electron and hole ejection efficiencies. To avoid Joule heat, the regions 22 and 30 have a small thickness. The region 24 is a base region of the PNP transistor (22, 24, 22) and is lightly doped and has a comparably larger thickness to provide a high breakdown voltage for the center P-N junction 26. The base width or thickness of the region 24, must be greater than the width of the depletion region of the blocking junction at voltage breakdown to prevent punch-through of the device. The thickness and doping level of the region 22 is controlled to tailor the efficiency of the NPN transistor (24, 22, 30). The gate and cathode regions, 22 and 30 respectively are designed to give uniform turn-on of the rectifier to prevent local heating and possible device failure.

Referring now to FIG. 10, there is shown a semiconductor controlled rectifier 210 embodying four regions 212, 214, 216 and 218 of alternate and opposite type conductivity formed by the contiguous surfaces of the respective pairs of regions 212 and 214, 214 and 216 and 218 of opposite type conductivity. The body 220 of the rectifier 210 may have a PNPN configuration or an NPNP configuration. An electrically conductive support member 228 comprising a material selected from the group consisting of molybdenum, tungsten, tantalum and combinations and base alloys thereof is suitably joined to the bottom surface 230 of the body 220 by employment of a suitable layer 232 of ohmic electrical solder material. An ohmic electrical contact is thereby provided between the member 228 and the region 212. An electrical contact 234 is affixed by a layer 236 of ohmic electrical solder to a selected surface area of the top surface 238 of the body 220 and also the regions 216 and 218. A gate control electrode 240 is affixed by a layer of 242 of ohmic electrical solder to a second selective surface area of the body 220 and the region 216. A shorted emitter configuration is provided by the formation of the plurality of regions 218 of opposite type conductivity formed in the region 216. The contact 234 is in an ohmic electrical contact with the regions 218 and 216 simultaneously.

The regions of the semiconductor controlled rectifier may be made entirely by the temperature gradient zone melting (TGZM) process of this invention or by a combination of TGZM and either diffusion or alloying. In particular, the regions 212, 214 and 216 are formed by the TGZM process. For example, the regions 212 and 216 may each be approximately 1 mil thick and be of P-type conductivity formed by migrating aluminum "wires" through a body 220 of N-type conductivity and having a carrier concentration of $1 \times 10^{14}$ carriers per cubic centimeter which comprises the region 214. The regions 212 and 216 are recrystallized and semiconductor material of the body 220 having solid solubility of the metal of the "wire" therein and each has a carrier concentration of $2 \times 10^{19}$ atoms per cubic centimeter.

The regions 218 form a shorted emitter geometry for the device 210. The region 218 may be made by any one of several processes including temperature gradient zone melting, diffusion and alloying. A temperature gradient zone melting process may provide an array of columnar regions 218 in the region 216 or a plurality of spaced lamellar regions 218 in the region 216. In the alloying process, the regions 218 may be produced by recrystallization of the material of the region 216 when the contact 234 is affixed to the surface 238 and contains an array of metal droplets comprising a suitable doping material such for example, as aluminum or antimony in silver. The shorted emitter configuration results in a high dv/dt capability for the device 210. This enables the device 210 to be turned on and off rapidly and to enable the device to withstand the resulting transients established within the device.

Figure 11:
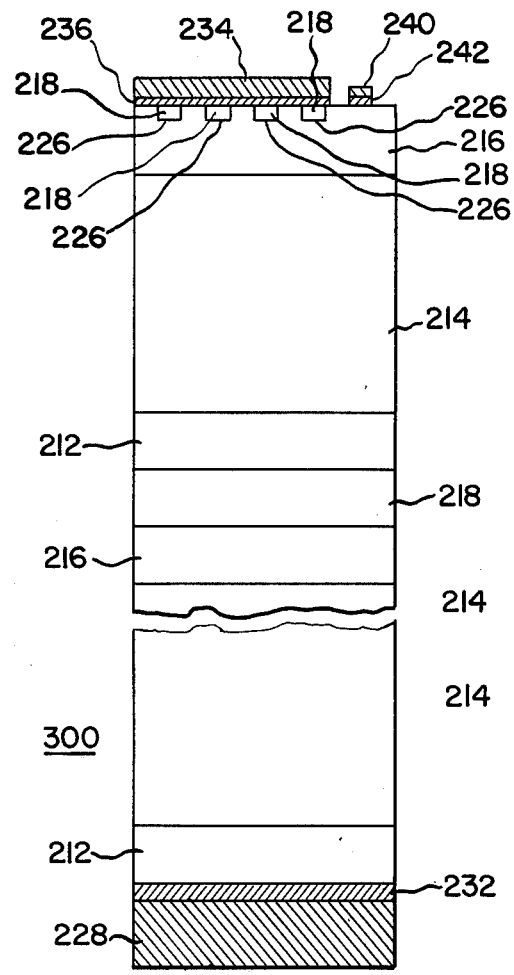

With reference to FIG. 11, there is shown a semiconductor controlled rectifier 300 which is an alternate embodiment of the rectifier 210. All items denoted by the same reference numerals for both rectifiers 210 and 300 are the same, and function in the same manner, as described heretofore. However, the rectifier 300 contains a plurality of pairs of regions of opposite type conductivity of the basic structure of the device 210 and the regions 218 are only required in that region 216 to which the contact 234 is affixed.

The invention has been described relative to practicing thermal gradient zone melting in a negative atmosphere. However, it has been discovered that when the body of semiconductor material is a thin wafer of the order of 10 mil thickness, the thermal gradient zone melting process may be practiced in an inert gaseous atmosphere of hydrogen, helium, argon and the like in a furnace having a positive atmosphere.

The thermomigration of metal wires is preferably practiced in accordance with the planar orientations, thermomigration directions, stable wire directions and stable wire sizes of Table I.

Table I

| Wafer Plane | Migration Direction | Stable Wire Directions | | Stable Wire Sizes |
|---|---|---|---|---|
| (100) | <100> | | <011>* | <100 microns |
| | | | <011>* | <100 microns |
| (110) | <110> | | <110>* | <150 microns |
| (111) | <111> | (a) | <011> | |
| | | | <101> | <500 microns |
| | | | <110> | |
| | | (b) | <112>* | |
| | | | <211>* | <500 microns |
| | | | <121>* | |
| | | (c) | Any other* Direction in (111) plane* | <500 microns |

*The stability of the migrating wire is sensitive to the alignment of the thermal gradient with the <100>, <110> and <111> axis, respectively.
+Group a is more stable than group b which is more stable than group c.

Figure 12:
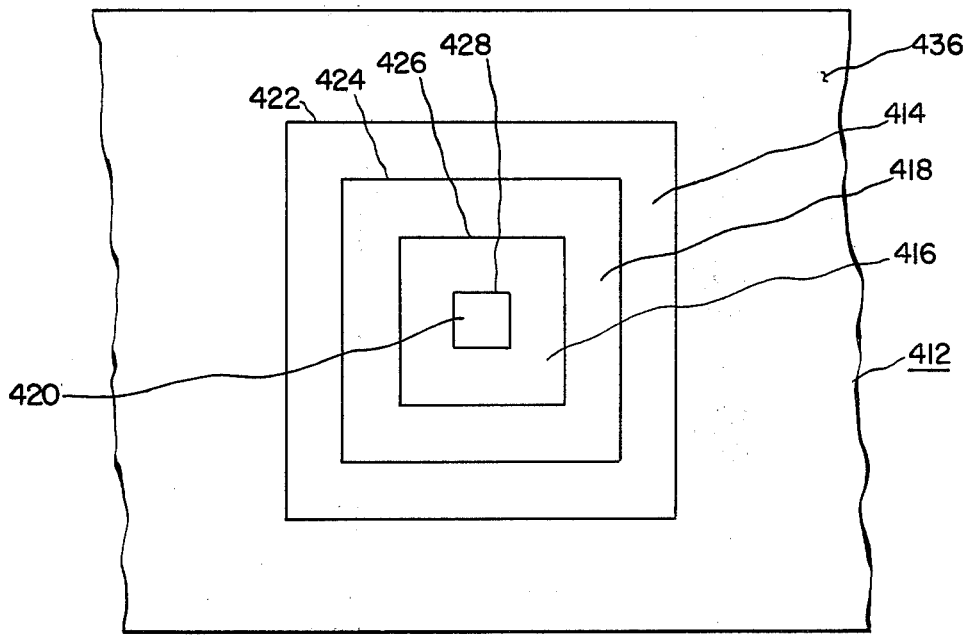
FIG. 12 is a top planar view of planar semiconductor controlled rectifier made in accordance with the teachings of this invention.

The thermal gradient zone melting process of this invention lends itself readily for the manufacture of a planar semiconductor controlled rectifier (SCR) for use in integrated circuits and the like. Referring now to FIG. 12, there is shown an SCR 410 fabricated in a substrate 412 of semiconductor material. The semiconductor material may be any of the aforementioned materials previously disclosed in this specification. For example, when the substrate 412 is of N-type silicon and has a selected resistivity, "wires" of aluminum, or comprising aluminum, may be thermomigrated through the substrate 412 to form regions 414 and 416 of P-type conductivity. The widths and resistivities of the regions 414 and 416 are determined by the electrical characteristics of the desired operating characteristics of the finished SCR. "Wires" comprising antimony, in part, and an inert metal or a lifetime controlling metal such, for example, as gold, are thermomigrated through the substrate 412 to form N-type regions 418 and 420 of selected resistivities. Anyone of the regions 418 and 420 may also be formed without thermomigration of a suitable metal "wire" by making the region from the original substrate. Again, the width and resistivity of the regions is dependent on the SCR's operating characteristics. Where thermomigration is employed to form any or all of the regions 414, 416, 418 and 420, the materials of those regions so formed is recrystallized material of the substrate 412 with solid impurity of a metal therein to impart the selected type conductivity and selected resistivity thereto. The regions 414 and 416 are preferably formed by the thermomigration of "wires" in accordance with the preferred planar and line directions of Table I. The material of region 418, when practical, is the original material of the substrate 412 to minimize the required processing steps. P-N junctions 422, 424, 426 and 428 are formed by the contiguous surfaces of the respective pairs of regions 412 and 414, 414 and 418, 418 and 416, and 416 and 420 of opposite type conductivity. The SCR 410 is completed by affixing an anode lead 430 to region 414, a gate lead 432 to region 416 and cathode lead 434 to region 420.

The SCR 410 as depicted is of a P-N-P-N configuration. Configuration of N-P-N-P is also possible. The SCR 410 normally does not need a separate electrical isolation region around it to electrically isolate it from the substrate 412, as the P-N junction 422 affectively performs this function. However, if an N-P-N-P configuration is desired, either the substrate 412 need be of P-type material or a separate electrical isolation region must be formed, preferably by thermomigration of suitable metal wires through the substrate.

As illustrated in FIG. 12, the SCR 410 comprises concentric abutting planar regions. However, the SCR 410 may also be of a lamellar configuration, much like that of the device of FIG. 3, wherein the abutting planar regions extend across the full width of the substrate 412.

Figure 13:
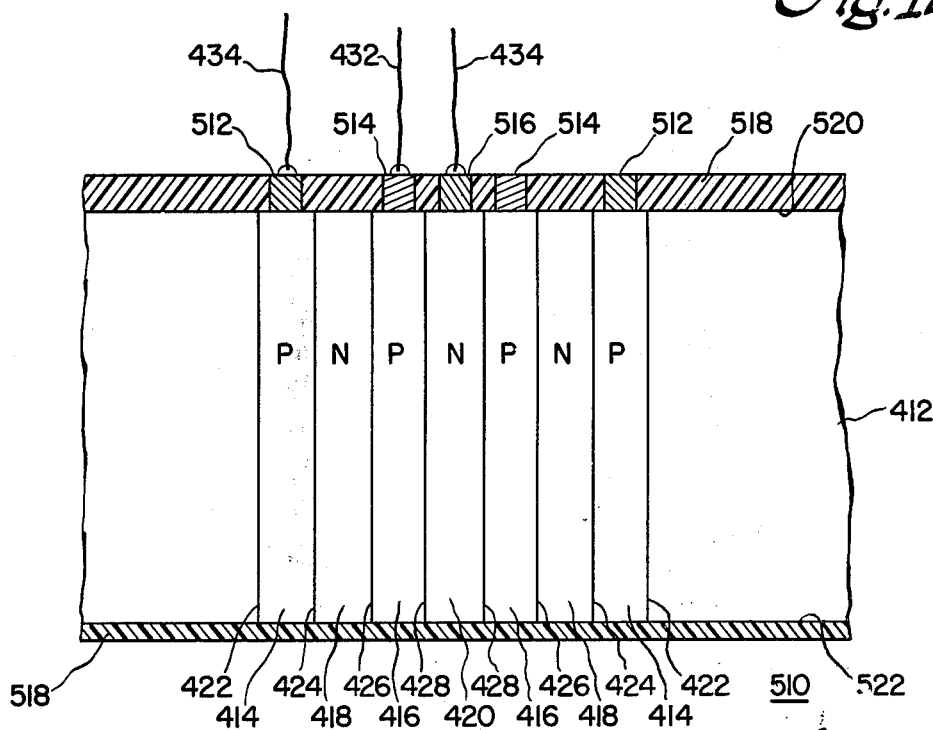
FIG. 13 is an elevation view, partly in cross-section, of an alternate embodiment of the semiconductor controlled rectifier of FIG. 12.

With reference to FIG. 13, there is shown a semiconductor controlled rectifier 510 which is an alternate embodiment of the SCR 412. Those items denoted by the same reference numbers for both SCR's are the same and function in the same manner as described heretofore. Employing photolithographical techniques and selective chemical etching, electrical contacts 512, 514 and 516 are affixed to the respective regions 414, 416 and 420. Preferably, contacts 512 and 514 are buss bar arrangements which encircle the top surface of the respective planar region. Electrical leads 430, 432 and 434 are affixed to the respective regions 414, 416 and 420 via the respective contacts 512, 514 and 516. A layer 518 of an electrically insulating material such, for example, as silicon oxide, silicon nitride, aluminum oxide and the like is disposed on selected surface areas of the SCR 510 and in particular on those portions of the P-N junctions 422, 424, 426 and 428 exposed in the respective two major exposed surfaces 520 and 522 of the substrate 412.

Alternatively the region 420 and therefore the P-N junction 428 may be formed by the thermomigration of a metal droplet through the substrate 412. It has been discovered that when the substrate 412 is of silicon, germanium, silicon carbide, gallium arsenide semiconductor material and the like, the thermomigrating metal droplet has a preferred shape which also give use to the region 420 being of the same shape as the migrating droplet. In a crystal axis direction of <111> of thermal migration, the droplet migrates as a triangular platelet laying in a (111) plane. The platelet is bounded on its edges by (112) planes. A droplet larger than 0.10 centimeter on an edge is unstable and breaks up into several droplets during migration. A droplet smaller than 0.0175 centimeter does not migrate into the body 10 because of a surface barrier problem.

The ratio of the droplet migration rate over the imposed thermal gradient is a function of the temperature at which thermomigration of the droplet 22 is practiced. At high temperatures, of the order of from 1000° C to 1400° C, the droplet migration velocity increases rapidly with increasing temperature. A velocity of 10 centimeters per day or $1.2 \times 10^{-4}$ centimeter per second is obtainable for aluminum droplets in silicon.

The droplet migration rate is also affected by the droplet volume. In an aluminum-silicon system, the droplet migration rate decreases by a factor of two when the droplet volume is decreased by a factor of 200.

A droplet thermomigrates in the <100> crystal axis direction as a pyramidal bounded by four forward (111) planes and a rear (100) plane. Careful control of the thermal gradient and migration rate is a necessity. Otherwise, a twisted region 420 may result. It appears that there is a non-uniform dissolution of the four forward (111) facets in that they do not always dissolve at a uniform rate. Non-uniform dissolution of the four forward (111) facts may cause the regular pyramidal shape of the droplet to become distorted into a trapezoidal shape. Therefore, to have the configuration of the region 420 shown in FIG. 12, the two major opposed surfaces of the SCR's 410 and 510 each has a preferred planar orientation of (100).

We claim as our invention:

1. A semiconductor device comprising a body of semiconductor material having a predetermined first type conductivity, a predetermined level of resistivity, two major opposed surfaces comprising the top and bottom surfaces thereof and a lamellar structure of at least four planar regions of alternate and opposite type conductivity formed in situ in the body and extending between, and terminating in, the opposed major surfaces;

the body having an axis substantially perpendicular to the two major opposed surfaces and substantially parallel with a first preferred crystal axis of the material of the of the body;

at least one of the major opposed surfaces having a preferred crystal planar orientation which is one selected from the group consisting of (111), (110) and (100);

a plurality of first planar regions of first regions of first type conductivity comprising at least two of the planar regions;

a plurality of second regions of second type conductivity comprising at least two of the planar regions;

each of the first and second regions being aligned substantially with a preferred second crystal axis of the body;

the material of at least each second region consisting of recrystallized semiconductor material of the body which is formed in situ by the migration of a melt of a metal-rich semiconductor material of the body, which comprises at least one dopant material, by thermal gradient zone melting at a predetermined elevated temperature along a thermal gradient substantially parallel with the first preferred crystal axis and the axis of the body substantially perpendicular to the major surface having the preferred crystal planar orientation, and having a predetermined level of concentration of the metal of the melt as determined by the solid solubility limit of that metal in that semiconductor material at that predetermined elevated temperature of migration and the metal is distributed substantially uniformly throughout the entire region to provide a substantially uniform level of resistivity throughout the entire region and to impart the predetermined type conductivity thereto and having a substantially uniform cross-section throughout the entire region;

each of the first and second regions having opposed major surfaces;

one of the major surfaces of one of the first regions being coextensive with one of the opposed major surfaces of the body;

a first P-N junction formed by the contiguous surfaces of the other opposed major surface of the first region and the mutually adjacent major opposed surface of the adjacent second region;

one of the major surfaces of one of the second regions being coextensive with the other of the opposed major surfaces of the body;

a second P-N junction formed by the contiguous surfaces of the other of the major opposed surfaces of the second region and one of the adjacent major opposed surfaces of the adjacent first region;

a plurality of third P-N junctions, each third P-N junction being formed by a remaining pair of contiguous major opposed surfaces of each pair of mutually adjacent first and second regions of opposite type conductivity;

a first electrical contact affixed to, and in an electrical conductive relationship with, a selected surface area of the region which has a surface coextensive with one of the two major opposed surfaces of the body;

a second electrical contact affixed to, and in an electrical conductive relationship with, a selected surface area of the other region having a surface coextensive with the other of the two major opposed end surfaces of the body, and gating means for biasing at least one of the first, the second and the plurality of third P-N junctions to at least switch the semiconductor device into an "on" condition.

2. The semiconductor device of claim 1 wherein
the at least one of the opposed major surface has a preferred planar crystal orientation of (100) and
the second crystal axis is one selected from the group consisting of < 011 > and < 011 >.

3. The semiconductor device of claim 2 wherein
the semiconductor material of the body is one selected from the group consisting of silicon, germanium, silicon carbide and gallium arsenide.

4. The semiconductor device of claim 1 wherein
the at least one of the opposed major surfaces have a preferred planar crystal orientation of (110) and
the second crystal axis is < 110 >.

5. The semiconductor device of claim 4 wherein
the material of the body is silicon, silicon carbide, germanium and gallium arsenide.

6. The semiconductor device of claim 1 wherein
the at least one of the opposed major surfaces has a preferred planar crystal orientation of (111), and each recrystallized region has any stable wire direction for a (111) planar orientation of the surface.

7. The semiconductor device of claim 6 wherein the second crystal axis is one selected from the group consisting of < 011 >, < 101 >, < 110 >, < 112 >, < 211 > and < 121 >.

8. The semiconductor device of claim 7 wherein the material of the body is one selected from the group consisting of silicon, silicon carbide, germanium, and gallium arsenide.

9. The semiconductor device of claim 6 wherein the material of the body is one selected from the group consisting of silicon, silicon carbide, germanium and gallium arsenide.

10. The semiconductor device of claim 1 wherein the gating means includes an ability to focus radiant energy on one of the P-N junctions, the radiant energy being of a suitable wave length sufficient to at least switch the device to an "on" condition.

11. The semiconductor device of claim 1 wherein the semiconductor material is one selected from the group consisting of silicon, silicon carbide, gallium arsenide and germanium.

12. The semiconductor device of claim 1 wherein the semiconductor material is silicon, and the dopant impurity material is aluminum.

13. The semiconductor device of claim 12 wherein the semiconductor material is silicon,
the lamellar structure consists of 4 alternate regions of P and N type conductivity,
each P type region is formed in situ by thermal gradient zone melting and the dopant material aluminum of a level of concentration of $2 \times 10^{19}$ atoms per cubic centimeter,
the N type region disposed between the two P type regions is formed in situ by thermal gradient zone melting and at least one dopant material is antimony of a level of concentration of about $1 \times 10^{19}$ atoms per cubic centimeter, and
the other N type region has a resistivity of 10 ohm-centimeter and a dopant concentration of about $1 \times 10^{14}$ atoms of antimony per cubic centimeter.

14. The semiconductor device of claim 13 wherein the doping impurity material of the other of the first regions is antimony.

15. The semiconductor device of claim 14 including gold as a second dopant impurity material distributed substantially uniformly throughout the other of the first regions by the thermal gradient zone melting process to control the lifetime of the silicon in that region.

16. The semiconductor device of claim 12 wherein each of the P-N junctions is a step junction and has a width of approximately 0.3 micron.

17. The semiconductor device of claim 1 wherein the gating means includes a means for focusing a light source on one of the P-N junctions, the light being of a suitable wave length sufficient to switch the device into "on" and "off" states.

18. The semiconductor device of claim 17 wherein the semiconductor material is one selected from the group consisting of silicon, silicon carbide, gallium arsenide and germanium.

19. The semiconductor device of claim 18 wherein the semiconductor material is silicon, and the dopant impurity material is aluminum.

20. The semiconductor device of claim 19 wherein each of the P-N junctions is a step junction and has a width of approximately 0.3 micron.

21. A semiconductor controlled rectifier comprising four concentric abutting planar regions of alternate and opposite type conductivity and selected resistivity formed in situ in a substrate of single crystal semiconductor material having two major opposed surfaces, the first and third regions being of the same, and a first, type conductivity and the second and fourth regions being of the same and a second and opposite, type conductivity;
a first P-N junction formed by the contiguous surfaces of the first and second regions of opposite type conductivity;
a second P-N junction formed by the contiguous surfaces of the second and third regions of opposite type conductivity;
a third P-N junction formed by the contiguous surfaces of the third and fourth regions of opposite type conductivity;
a first electrical lead affixed to the first region;
a second electrical lead affixed to the third region, and
a third electrical lead affixed to the fourth region, and wherein
each planar region extends entirely between and terminates in the two opposed major surfaces and the material of each of at least two of the planar regions consists of recrystallized semiconductor material of the substrate which is formed in situ by the migration of a melt of a metal-rich semiconductor material of the substrate by thermal gradient zone melting at a predetermined elevated temperature along a thermal gradient substantially parallel with a first preferred crystal axis of the material of the substrate and having a predetermined level of concentration of the melt as determined by the solid solubility limit of that metal in that semiconductor material at that predetermined elevated temperature of migration and the metal, which includes at least one dopant material, for the material of the substrate is distributed substantially uniformly throughout the respective entire region to impart a selected type conductivity and a selected resistivity thereto.

22. The semiconductor controlled rectifier of claim 21 wherein
the material of the substrate is silicon of N-type conductivity, and
the first and third regions are of P-type conductivity.

23. The semiconductor controlled rectifier of claim 24 wherein
the material of the substrate is silicon of N-type conductivity, and
the first and third regions are of P-type conductivity and the dopant material is aluminum.

24. A semiconductor device comprising
a body of semiconductor material having a predetermined first type conductivity, a predetermined level of resistivity, two major opposed surfaces being, respectively, the top and bottom surfaces thereof and a lamellar structure of at least three planar regions formed in situ in the body;
the body having an axis substantially perpendicular to at least top surface of the body and substantially parallel with a first preferred crystal axis of the material of the body;

at least one of the opposed major surfaces having a preferred crystal planar orientation which is one selected from the group consisting of (111), (110) and (100);

each of the three planar regions having a preferred crystal axis which is substantially parallel with the at least one surface having the preferred crystal planar orientation and perpendicular to the first preferred crystal axis;

the material of each of at least first and third planar regions consisting of recrystallized semiconductor material of the body which is formed in situ by the migration of a melt of a metal-rich semiconductor material of body by thermal gradient zone melting at a predetermined elevated temperature along a thermal gradient substantially parallel with the first preferred crystal axis and the axis of the body and having a predetermined level of concentration of the metal of the melt as determined by the solid solubility limit of that metal in that semiconductor material at that predetermined elevated temperature of migration and the metal, which includes at least one dopant material for the material of the body, is distributed substantially uniformly throughout the entire region;

a surface area of the first region being coextensive with the bottom surface of the body;

a surface area of the third region being coextensive with the top surface of the body;

the material of the second region comprising the material of the body;

a first P-N junction formed by the abutting surfaces of the first and second regions of opposite type conductivity;

a second P-N junction formed by the abutting surfaces of the second and third regions of opposite type conductivity;

a plurality of spaced fourth regions of first type conductivity formed in a predetermined portion of the third region, each fourth region having a surface area coextensive with a predetermined surface of the body and the surface area of the third region and each fourth region extends a predetermined distance into the third region from that predetermined surface, the predetermined surface being substantially parallel to the first and second P-N junctions;

a plurality of third P-N junctions, each junction being formed by the contiguous surfaces of the material of opposite type conductivity of each fourth region and the third region;

a first electrical contact affixed to and in ohmic electrical contact with, a selected surface area of the first region;

a second electrical contact affixed to, and in ohmic electrical contact with, a selected portion of the surface area of predetermined surface of the third region and the surface areas of the plurality of fourth regions, and a third electrical contact affixed to, and in ohmic electrical contact with, a portion of the remainder of the surface area of the predetermined surface of the third region.

25. The semiconductor device of claim 24 wherein the lamellar structure includes at least two groups of three alternate regions of opposite type conductivity, one group having a first region having the surface area comprising the bottom surface of the body and the second group having a third region having a surface area comprising the top surface of the body; and including a fifth region of first type conductivity and a selected dopant impurity concentration disposed between and in abutting contact with the third region of one group and the first region of the next adjacent group;

a fourth P-N junction formed by the contiguous surfaces of the third region of the one group and the fifth region, and a fifth P-N junction formed by the contiguous surfaces of the fifth region and the first region of the next adjacent group.

26. The semiconductor device of claim 25 wherein the material of each fifth region consists of recrystallized semiconductor material of the body which is formed in situ by the migration of a melt of a metal-rich semiconductor material of the body by thermal gradient zone melting at a predetermined elevated temperature along a thermal gradient substantially parallel with the first preferred crystal axis and the axis of the body and having a predetermined level of the metal of the melt as determined by the solid solubility limit of that metal in that semiconductor material at that predetermined elevated temperature of migration and the metal includes at least one dopant material for the material of the body which has a substantially uniform level of concentration throughout the region.

* * * * *